(12) United States Patent
Faure

(10) Patent No.: US 8,912,081 B2
(45) Date of Patent: Dec. 16, 2014

(54) STIFFENING LAYERS FOR THE RELAXATION OF STRAINED LAYERS

(75) Inventor: Bruce Faure, Grenoble (FR)

(73) Assignee: SOITEC, Bernin (FR)

( * ) Notice: Subject to any disclaimer, the term of this patent is extended or adjusted under 35 U.S.C. 154(b) by 722 days.

(21) Appl. No.: 13/055,123

(22) PCT Filed: Jul. 2, 2009

(86) PCT No.: PCT/EP2009/004790
§ 371 (c)(1),
(2), (4) Date: Jan. 20, 2011

(87) PCT Pub. No.: WO2010/022814
PCT Pub. Date: Mar. 4, 2010

(65) Prior Publication Data
US 2011/0127640 A1 Jun. 2, 2011

(30) Foreign Application Priority Data
Aug. 25, 2008 (EP) .................................. 08290797

(51) Int. Cl.
*H01L 21/20* (2006.01)
*H01L 29/20* (2006.01)
*H01L 21/02* (2006.01)
*H01L 21/84* (2006.01)

(52) U.S. Cl.
CPC ...... *H01L 21/02488* (2013.01); *H01L 21/0242* (2013.01); *H01L 21/0254* (2013.01); *H01L 21/02664* (2013.01); *H01L 21/84* (2013.01)
USPC .................. 438/483; 257/615; 257/E29.089; 257/E21.09

(58) Field of Classification Search
None
See application file for complete search history.

(56) References Cited

U.S. PATENT DOCUMENTS

| 4,994,867 | A | 2/1991 | Biegelsen | 357/16 |
|---|---|---|---|---|
| 5,391,257 | A | 2/1995 | Sullivan et al. | 156/630 |
| 5,670,411 | A | 9/1997 | Yonehara et al. | 437/62 |
| 5,965,939 | A | 10/1999 | Kim et al. | 257/752 |
| 6,071,795 | A | 6/2000 | Cheung et al. | 438/458 |
| 6,214,733 | B1 | 4/2001 | Sickmiller | 438/691 |
| 6,406,795 | B1 | 6/2002 | Hwang et al. | 428/457 |

(Continued)

FOREIGN PATENT DOCUMENTS

| EP | 0651439 | 5/1995 |
|---|---|---|
| EP | 0 858 110 A1 | 8/1998 |

(Continued)

OTHER PUBLICATIONS

Non-Final Office Action, U.S. Appl. No. 13/056,572, dated Apr. 11, 2012.

(Continued)

*Primary Examiner* — Michael Lebentritt
*Assistant Examiner* — Kevin Quinto
(74) *Attorney, Agent, or Firm* — TraskBritt

(57) ABSTRACT

The present invention relates to a method for relaxing a strained material layer by providing a strained material layer and a low-viscosity layer formed on a first face of the strained material layer; forming a stiffening layer on at least one part of a second face of the strained material layer opposite to the first face thereby forming a multilayer stack; and subjecting the multilayer stack to a heat treatment thereby at least partially relaxing the strained material layer.

16 Claims, 1 Drawing Sheet

(56) References Cited

U.S. PATENT DOCUMENTS

| | | | |
|---|---|---|---|
| 6,562,127 | B1 | 5/2003 | Kud et al. |
| 6,794,276 | B2 | 9/2004 | Letertre et al. ............... 438/506 |
| 6,946,373 | B2 | 9/2005 | Agnello et al. ............... 438/509 |
| 7,018,909 | B2 | 3/2006 | Ghyselen et al. ............. 438/455 |
| 7,273,798 | B2 | 9/2007 | Lester et al. .................. 438/458 |
| 7,282,381 | B2 | 10/2007 | Feltin et al. ..................... 438/46 |
| 7,585,792 | B2 | 9/2009 | Celler ........................... 438/795 |
| 7,736,935 | B2 | 6/2010 | Faure et al. ...................... 438/59 |
| 7,981,767 | B2 | 7/2011 | Guenard et al. |
| 8,048,693 | B2 | 11/2011 | Letertre et al. |
| 8,058,663 | B2 | 11/2011 | Fan et al. ......................... 257/98 |
| 2003/0064535 | A1 | 4/2003 | Kub et al. ........................ 438/22 |
| 2004/0192067 | A1 | 9/2004 | Ghyselen et al. ............. 428/763 |
| 2004/0195656 | A1* | 10/2004 | Ghyselen et al. ............. 257/616 |
| 2004/0253792 | A1 | 12/2004 | Cohen et al. .................. 438/400 |
| 2005/0250294 | A1 | 11/2005 | Ghyselen et al. ............. 438/458 |
| 2006/0094140 | A1 | 5/2006 | Inoguchi et al. ................ 438/22 |
| 2006/0128117 | A1 | 6/2006 | Ghyselen et al. ............. 438/455 |
| 2006/0175608 | A1 | 8/2006 | Celler ............................... 257/49 |
| 2006/0205180 | A1 | 9/2006 | Henley et al. ................. 438/458 |
| 2006/0211219 | A1 | 9/2006 | Henley et al. ................. 438/458 |
| 2007/0017438 | A1 | 1/2007 | Xie et al. |
| 2007/0048975 | A1 | 3/2007 | Chen et al. .................... 438/478 |
| 2007/0069225 | A1* | 3/2007 | Krames et al. .................. 257/94 |
| 2007/0072324 | A1 | 3/2007 | Krames et al. .................. 438/46 |
| 2007/0241353 | A1 | 10/2007 | Taki ................................. 257/94 |
| 2007/0278622 | A1 | 12/2007 | Lester et al. ................... 257/615 |
| 2007/0287273 | A1 | 12/2007 | Boussagol et al. ............ 438/503 |
| 2007/0298549 | A1 | 12/2007 | Jurczak et al. ................ 438/149 |
| 2008/0113496 | A1 | 5/2008 | Keller et al. ................... 438/481 |
| 2008/0169483 | A1 | 7/2008 | Kasai et al. .................... 257/183 |
| 2008/0211061 | A1 | 9/2008 | Atwater, Jr et al. |
| 2008/0296609 | A1 | 12/2008 | Nagahama et al. ............ 257/103 |
| 2009/0050917 | A1 | 2/2009 | Nakagawa et al. .............. 257/98 |
| 2009/0261344 | A1 | 10/2009 | Celler ............................... 257/75 |
| 2010/0032793 | A1 | 2/2010 | Guenard et al. ............... 257/507 |
| 2010/0032805 | A1 | 2/2010 | Letertre et al. ................ 257/615 |
| 2011/0143522 | A1 | 6/2011 | Letertre et al. |
| 2011/0180911 | A1 | 7/2011 | Guenard et al. |
| 2012/0214291 | A1 | 8/2012 | Letertre et al. |

FOREIGN PATENT DOCUMENTS

| | | |
|---|---|---|
| EP | 1378591 A1 | 1/2004 |
| EP | 1 671 361 B1 | 4/2007 |
| EP | 1901345 | 3/2008 |
| FR | 2775121 | 8/1999 |
| FR | 2851847 | 9/2004 |
| FR | 2895420 | 6/2007 |
| FR | 2895562 | 6/2007 |
| JP | 2001168342 A | 6/2001 |
| JP | 2006519488 | 8/2006 |
| JP | 2008004910 A | 1/2008 |
| WO | WO 2004/077552 A1 | 9/2004 |

OTHER PUBLICATIONS

Non-Final Office Action, U.S. Appl. No. 13/056,572, dated Sep. 21, 2012.
International Search Report, PCT/EP2009/004790, mailed Sep. 23, 2009.
European Search Report for EP 08 29 0759 dated Apr. 14, 2009.
European Search Report for EP 08 29 0757.7 dated Mar. 16, 2009.
Notice of Allowance dated Feb. 24, 2010, U.S. Appl. No. 12/341,806, filed Dec. 22, 2008.
Di Cioccio, L. et al., "III-V Layer Transfer Onto Silicon and Applications", Phys. Stat. Sol., vol. (a) 202, No. 4, pp. 509-515 (2005).
Feng et al., "Stress Generation and Relaxation during Film Heteroepitaxy on a Compliant Substrate with a Viscoelastic Glass Interlayer", Mat. Res. Soc. Symp. Proc., 696:N3.19.1-N3.19.6 (2002).
Hansen et al., "Development of a glass-bonded compliant substrate", Journal of Crystal Growth, 195:144-150 (1998).
Hobart, K.D. et al., "Compliant Substrates: A Comparative Study of the Relaxation Mechanisms of Strained Films Bonded to High and Low Viscosity Oxides", Journal of Electronic Materials, vol. 29, No. 7, pp. 897-900 (2000).
Huang, R. et al., XP009112211 "Mechanics of Relaxing SiGe Islands on a Viscous Glass", Acta Mechanica Sinica, vol. 18, No. 5, pp. 441-456 (2002).
Kostrzewa, M. et al, "Feasibility of Strain Relaxed InAsP and InGaAs Compliant Substrates", pp. 437-440 (2003).
Mooney, P. M. et al., "Elastic Strain Relaxation in Free-Standing SiGe/Si Structures", Applied Physics Letters, vol. 84, No. 7, pp. 1093-1095 (2004).
Moran et al., "Kinetics of Strain Relaxation in Semiconductor Films Grown on Borosilicate Glass-Bonded Substrates", Journal of Electronic Materials, 30(7):802-806 (2001).
Peng, C. X. et al., "Influence of GaN polarity and intermediate-temperature buffer layers on strain relaxation and defects", Physica B, vol. .391, No. 1, pp. 6-11 (2007).
Yin, Haizhou et al., "Buckling Suppression of SiGe Islands on Compliant Substrates", Journal of Applied Physics, vol. 94, No. 10, pp. 6875-6882 (2003).
Yin, Haizhou et al., "Fully-depleted Strained-Si on Insulator NMOSFETs without Relaxed SiGe Buffers", IEDM International Electron Devices Meeting, pp. 03-53-03-56 (2003).
Yin, Haizhou et al., "Tunable Uniaxial vs. Biaxial In-Plane Strain Using Compliant Substrates", Applied Physics Letters, vol. 87, pp. 61922-1-61922-3 (2005).
Yin, Haizhou et al., "Strain Relaxation of SiGe Islands on Compliant Oxide", Journal of Applied Physics, vol. 91, No. 12, pp. 9716-9722 (2002).
Non-Final Office Action for U.S. Appl. No. 12/341,852 mailed Dec. 17, 2010.
Final Office Action for U.S. Appl. No. 12/341,852 mailed Jan. 21, 2011.
Notice of Allowance for U.S. Appl. No. 12/341,852 mailed Feb. 24, 2011.
Notice of Allowance for U.S. Appl. No. 12/341,852 mailed Apr. 18, 2011.
Non-Final Office Action (Restriction Requirement) for U.S. Appl. No. 12/341,722 mailed Dec. 9, 2010.
Non-Final Office Action for U.S. Appl. No. 12/341,722 mailed Mar. 2, 2011.
U.S. Appl. No. 12/341,852, filed Dec. 22, 2008.
U.S. Appl. No. 13/081,788, filed Apr. 7, 2011.
U.S. Appl. No. 12/341,722, filed Dec. 22, 2008.
U.S. Appl. No. 13/056,572, filed Mar. 4, 2011.
International Search Report, PCT/EP2009/005694, mailed Mar. 25, 2010.

* cited by examiner

STIFFENING LAYERS FOR THE RELAXATION OF STRAINED LAYERS

CROSS-REFERENCE TO RELATED APPLICATION

This application is a 371 filing of International Patent Application PCT/EP2009/004790 filed Jul. 2, 2009.

FIELD OF INVENTION

The present invention relates to the field of strained layers and compliant substrates for application in the manufacture of semiconductor devices useful in electronic, opto-electronic, photovoltaic field and, in particular, to the relaxation of strained films by the use of compliant substrates.

BACKGROUND OF THE INVENTION

When native bulk substrates are not available or are too expensive, useful materials are often formed by heteroepitaxy on seed substrates so that the growth of thin films on substrates by heteroepitaxy becomes an important manufacturing step in the semi-conductor technology. For instance, in the field of light-emitting semiconductor devices or solar cells there is a need to grow heteroepitaxial films on substrates as sapphire or SiC to form subsequently a final semiconductor device. After transfer of the heteroepitaxial films to another substrate these films can, for instance, be used for epitaxial growth of layers used in electronic and opto-electronic applications. However, when films are formed by heteroepitaxy on substrates with a different lattice constants and different coefficients of thermal expansion as compared to the ones of the films detrimental effects on material quality of layers grown on the films are caused by misfit compressive or tensile strain and the corresponding generation of dislocations and cracks. Thus, in the art compliant substrates, including vitreous layers, have been provided between the substrates and the heteroepitaxial films in order to release misfit strains.

However, presently used methods for the relaxation of strained heteroepitaxial films often not show satisfying results with respect to the suppression of buckling and the formation of cracks, etc. Thus, it is a problem underlying the present invention to provide a method for the complete or almost complete lateral relaxation of a strained layer formed above a substrate that avoids or at least alleviates the above-mentioned defects.

SUMMARY OF THE INVENTION

The above-mentioned problem is solved by the present invention. In particular, the invention relates to a method for relaxing a strained material layer which comprises the steps:
providing a strained material layer and a low-viscosity layer comprising a compliant material and formed on a first face of the strained material layer;
forming a stiffening layer on at least one part of a second face (opposite to the first face) of the strained material layer without completely covering the strained material layer thereby forming a multilayer stack; and
subjecting the multilayer stack to a heat treatment (such that reflow of the compliant material layer is caused thereby) thereby at least partially relaxing the strained material layer.

The term "low-viscosity" is used to indicate deformation ability of the thus specified layer during the heat treatment (see also discussion below). In particular, the heat treatment (thermal treatment, annealing) at a temperature above the glass transition temperature results in some reflow (plastic deformation, e.g., due to some glass transition) of the compliant material thereby causing elastical relaxation of the adjacent strained material layer. The low-viscosity layer can, e.g., be a buried layer comprising borophosphosilicate glass that reflows under heat treatment. The buried layer may, for example, be an oxide layer. The multilayer stack may also include some support substrate on which the low-viscosity layer was formed (see detailed description below).

Different from the art a stiffening layer is provided partially atop of the strained material layer. During the heat treatment parts of the compressively strained material layer that are exposed (not covered by the stiffening layer) can freely expand laterally thereby relaxing strain without significant buckling. By an appropriate choice of the size of the regions of the strained material layer that are covered by the stiffening layer the percentage of relaxation of the strained material layer during heat treatment can readily be controlled. In case of tensively strained material, the material exposed may freely contract while keeping its flatness, without forming crack or surface roughness.

The step of the formation of the stiffening layer may comprise depositing the stiffening layer as a continuous layer on the entire surface of the strained material layer and subsequently patterning the deposited stiffening layer such that the stiffening layer is partially removed from the strained material layer. The patterning may be performed such that the stiffening layer partially covers the strained material layer and exposing the strained material layer at the edges. Patterning can be achieved by dry etching and photolithography and results in islands (stiffening islands) of the stiffening layer atop of the strained material layer. This kind of patterning can, thus, be readily achieved in a reliable and relatively time-saving way. The dimensions of the stiffening islands can be exactly controlled by the usage of photolithography. It is assumed that the portions of the strained material layer underneath the stiffening islands are not or almost not relaxed during the heat treatment.

According to an embodiment of the herein disclosed method for relaxing a strained material layer the subsequently performed steps of patterning the stiffening layer and subjecting the multilayer stack to the heat treatment are repeated in this order at least once. In other words, the original continuous stiffening layer is patterned to obtain the above-mentioned stiffening islands at a predetermined size and, then, a first heat treatment is performed in order to relax the portions of the strained material layer that are not covered by the stiffening islands. Subsequently, the sizes of the stiffening islands are reduced and a second heat treatment is carried out thereby relaxing portions of the strained material layer that were covered by the stiffening islands during the first heat treatment process.

The repeated patterning and heat treatment can be performed until the desired degree (percentage) of relaxation of the strained material layer is achieved (which can very accurately be controlled by this sequence of processing) or, in particular, until no residuals of the stiffening islands are left and/or complete relaxation of the strained material layer is achieved. Different from the art complete relaxation can be achieved by the repeated heat treatments with different sizes of stiffening islands without causing significant buckling or other defects of the strained material layer.

The strained material layer may also be patterned, in particular, by etching one or more trenches thereby forming strained material islands in order to facilitate the relaxation. Moreover, the low-viscosity layer may be patterned in accordance with the strained material layer. In particular, one or more trenches might be etched through the strained material layer and the low-viscosity layer down to a support substrate on that the low-viscosity layer was deposited or to which it was bonded beforehand. The trenches may also be performed within the low-viscosity without reaching the support substrate. Furthermore, the stiffening layer can be patterned in such a way that islands of the stiffening layer are formed centered on islands of the strained material layer for an accurate control of the partial relaxation of the strained material islands. In principle, the islands made from the stiffening and the strained material layers may be shaped in rectangular, circular or any other form considered appropriate for the further the processing.

In the following, the term "strained material" may refer to a continuous layer of a patterned layer exhibiting islands, where it is appropriate.

Whereas III/N material chosen from a binary, ternary or quaternary alloy can be used for the strained layer the present invention proves particularly advantageous when the strained material layer comprises or consists of InGaN. The content of Indium in InGaN material may be up to 35%, preferably the content of indium may be less than 10% and more preferably the content may be between 4% and 7%. The low-viscosity layer may comprise or consist of borophosphosilicate glass (BPSG) or an $SiO_2$-compound comprising boron or phosphorous. For instance, a borosilicate glass (BSG) or phosphosilicate glass (PSG) may be used. The reflow characteristics can be controlled by the content of boron and phosphorous atoms. 4-5% of weight boron 2% of weight phosphorous represent appropriate choices.

The material of the stiffening layer shall be chosen according to the mechanical ability to suppress strain relaxation of the portions of the strained material layer that are covered by the stiffening (islands). Moreover, a more rigid material allows for a thinner stiffening layer, whereas a less rigid material raises the need for a thicker layer in order to obtain the desired partial stiffening of the strained material layer during the heat treatment. For example, a stiffening layer may have a thickness from 50 nm and up to 5 times the thickness of the strained layer.

According to an example, the stiffening layer comprises or consists of III-N materials, SiN ($Si_3N_4$ or SiN:H,) SiON or $SiO_2$ which proves a reliable stiffening means particularly in the case of a strained InGaN layer formed over a buried layer comprising borophosphosilicate glass or an $SiO_2$-compound comprising boron or phosphorous. The stiffening layer, in particular, a stiffening layer of $Si_3N_4$, can be deposited with a thickness of between 100 nm to 300 nm in order to reliably suppress buckling of the strained material layer of about 100 nm thickness during the relaxing heat treatment. The stiffening layer may also be deposited with a thickness of up to 5 times the thickness of the strained material layer.

As already described above the steps of patterning the stiffening layer and performing heat treatment of the multi-layer stack comprising both the strained material layer and the stiffening layer might be repeated once or several times. Each subsequent heat treatment is performed for a larger exposed (not covered by the stiffening islands) area of the strained material layer. The measurement of exposed area to relax may be adjusted depending for example on the capability of the low viscosity layer to reflow, the temperature used and also the Young's modulus of the strained material. According to an embodiment in each step of patterning of the stiffening layer about 100 μm to 400 μm of the stiffening material in removed in one lateral dimension. This means that 100 μm to 400 μm more than in the preceding heat treatment of the strained material layer, in particular, a strained InGaN layer, is exposed between islands of the patterned stiffening layer, in particular, consisting of $Si_3N_4$, in one lateral dimension.

The entire surface of the strained material layer can, thus, by and by be exposed and can relax during the sequence of heat treatment processing. The final heat treatment may be performed with no stiffening layer remaining on the strained material layer. By reducing the size of the stiffening islands before each of the heat treatment processes the relaxation obtained by the individual heat treatment processes can be accurately controlled.

It should be noted that in the embodiments of the inventive method described above and different from the art the thickness of the low-viscosity layer can be chosen less than the expansion length or contraction length of the strained material layer during the heat treatment without causing buckling or cracking of the film. The expansion/contraction length is the length of lateral expansion/contraction during the elastic relaxation of the strained material and plastic deformation of the low-viscosity layer caused by the heat treatment.

Furthermore, according to another example of the present invention the above-described methods further comprise:
removing any residual parts of the stiffening layer so that the entire surface of the strained material is exposed and subjected to the heat treatment;
transferring the (completely or partially) relaxed strained material to another substrate by bonding the relaxed strained material to a layer deposited on the other substrate; and
detaching the low-viscosity layer from the relaxed strained material layer.

When the low-viscosity layer is deposited on or bonded to some support substrate this support substrate is also detached together with the low-viscosity layer. By this transfer of the relaxed strained material the surface opposing the surface of the relaxed strained material layer on which the stiffening layer was deposited becomes available for further processing, in particular, for epitaxy of material layers.

According to this method, when the strained material is polar, as for the c-plane III/N material, the polarity of the face of the relaxed strained material opposing the face of growth on the seed substance that is suitable for any subsequent epitaxial growth of layers can be exposed. Thus, active layer(s) may be formed on the surface of the relaxed strained material for application in opto-electronic or photovoltaic field.

The strained material layer of the above examples, can be provided by heteroepitaxial growth. In particular, the strained material layer, in particular, a strained InGaN layer, can be grown directly on a seed substrate or on a seed layer, in particular, a GaN layer, that is deposited on or attached to a seed support substrate in particular, a sapphire support substrate before the step of depositing the low-viscosity layer comprising the compliant material layer, in particular, borophosphosilicate glass, on the strained material layer; and the strained material layer may be detached from the seed substrate (layer) and bonded by the low-viscosity layer to a support substrate before depositing the stiffening layer, in particular, comprising $Si_3N_4$, on the strained material layer. The GaN seed layer detached with the strained material from the seed support substrate may also be the stiffening layer.

The herein disclosed method for relaxing a strained material layer is useful for the manufacture of semiconductor devices, in particular, opto-electronic devices or photovoltaic devices. Thus, herein it is provided a method for the manufacture of a semi-conductor device, comprising relaxing the strained material according to one of the preceding claims, and further comprising removing any residual parts of the stiffening layer so that the entire surface of the strained material is exposed and subjected to the heat treatment and epitaxially growing material layers on the formed at least partially relaxed strained material, in particular, growing active layers on the at least partially relaxed strained material islands.

Furthermore, it is provided a semiconductor structure, comprising a support substrate, a low-viscosity layer on the substrate, a continuous strained material layer or strained material islands on the low-viscosity layer, in particular, of InGaN material, and a stiffening layer partially covering the continuous strained material layer or the strained material islands, in particular, allowing 100 micrometers to 400 micrometers of exposed width of the strained material layer or the strained material islands.

BRIEF DESCRIPTION OF THE DRAWINGS

Additional features and advantages of the present invention will be described with reference to the drawings. In the description, reference is made to the accompanying figures that are meant to illustrate preferred embodiments of the invention. It is understood that such embodiments do not represent the full scope of the invention.

DETAILED DESCRIPTION OF THE INVENTION

Figure 1:
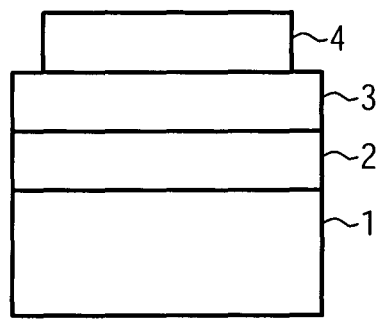
FIG. 1 illustrates an example of the inventive method for relaxing a strained material layer comprising the formation of a patterned stiffening layer atop of the strained material layer.

FIG. 1 shows an example of a multilayer stack formed according to the present invention. The multilayer stack comprises a support substrate 1, a low-viscosity layer 2, a strained material layer 3 and a patterned stiffening layer 4. The strained material layer 3 was heteroepitaxially grown on some seed substrate and transferred to the support substrate 1 by any wafer transfer process known in the art, e.g., by grind/etch back, by laser lift off, electromagnetic irradiation absorption or ion implantation within the SMART CUT® process. In this example, the low-viscosity layer 2 is a buried layer, e.g. a buried oxide layer, that may be composed of different individual layers and comprises at least a compliant layer (relaxing layer). The compliant layer includes without limitation borophosphosilicate glass (BPSG) or an $SiO_2$-compound comprising boron or phosphorus. The reflow rate during heat treatment can readily be adjusted by the boron and phosphorus content.

The patterned stiffening layer 4 is obtained by deposition of a stiffening layer and etching by means of photolithography. Thereby, the strained material layer 3 is exposed at the lateral edges. Heat (thermal) treatment at glass transition temperature of the relaxing layer, i.e., of about 800° C. to 850° C. for BPSG results in a partial elastic relaxation of the strained material layer 3 consisting of InGaN, for instance. For a lattice mismatch (as compared to the nominal lattice constant) of about 0.7% patterning of the stiffening layer by forming trenches with a lateral width of about 300 micrometers has proven suitable. Without willing to be bound by this theory it seems that the patterned stiffening layer 4 partially hinders relaxation of the strained material layer 3 below the stiffening island 4. After the heat treatment the size of the stiffening island is reduced in order to expose additionally about 300 micrometers in lateral dimension of the strained material layer 3 and a second heat treatment is performed in order to further relax the partially relaxed strained material layer 3 without severe buckling. This repeated process of reducing the sizes of the stiffening islands 4 and performing heat treatment may be performed until the strained material layer 3 is completely relaxed.

Possible residuals of stiffening material are removed, thus, an intact completely relaxed strained material layer is achieved that can be used for subsequent (homo)epitaxy of a crystalline layer, e.g., an InGaN layer, that can to be employed in the manufacture of a particular semiconductor device useful in electronic or opto-electronic applications as well as the manufacture of solar cells. Depending on the material polarity of the completely relaxed strained material layer 3 for the homoepitaxially grown crystalline layer the completely relaxed strained material layer 3 may be transferred from the support substrate 1 to another substrate, e.g., by means of another buried layer deposited on the other substrate. For example, the face Ga of relaxed strained c-plane InGaN material is preferred for epitaxial growth of crystalline layer.

According to another example, the multilayer stack shown in FIG. 2 was formed in some detail as follows. A strained material layer was heteroepitaxially grown on a seed layer deposited on or bonded to a first support substrate. The strained material layer is an InGaN layer, the seed layer is a GaN layer and the first support substrate is a sapphire substrate, for instance. It should be noted, however, that InGaN represents only one example for the material of the strained material layer. In fact, the strained material layer may be a semi-conductor material such as III/V material and may, for instance, comprise or consist of a III/N material chosen from a binary, ternary or quaternary alloy.

The thickness of the strained InGaN layer is about 100 nm and the layer comprises about 4% indium. The lattice mismatch of the heteroepitaxially grown strained InGaN layer 3 is about 0.4%. A buried layer comprising a borophosphosilicate glass layer as a compliant (relaxation) material layer is deposited with a thickness of about 500 nm on the strained InGaN layer 3. Optionally, before deposition of the buried layer an $SiO_2$ layer of a thickness of about 50 nm may be deposited on the strained InGaN layer in order to enhance the adherence between the gallium face of the strained c-plane InGaN layer and the buried layer.

Then, ionic species are implanted through the buried layer to form a weakened layer at about 400 nm in the InGaN/GaN materials. The weakened layer is provided in order to facilitate detachment of the seed layer and seed substrate. A second buried layer is deposited on the support substrate 1 shown in FIG. 2. The thickness of the second buried layer is about 4 micrometers. The support substrate 1 and the strained InGaN layer are bonded by the first and the second buried layers that together form the low-viscosity layer 2 of FIG. 2. After planarization and polishing before bonding the first and second buried layer, the thickness of the low-viscosity layer 2 is about 7 micrometers. After bonding the seed substrate is detached at the weakened layer and residual GaN material is removed by dry etching.

Figure 2:
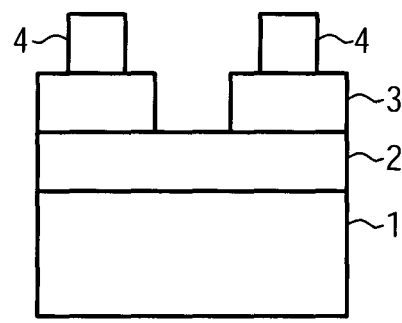
FIG. 2 illustrates another example of the inventive method for relaxing strained material islands wherein stiffening islands are formed atop of the strained material islands.

Next, the strained InGaN layer is patterned by lithography processing in order to form rectangular strained InGaN islands 3 of about 1 mm×1 mm as shown in FIG. 2. After patterning about 200 nm of stoichiometric $Si_3N_4$ is deposited on and between the strained InGaN islands 3. Deposition of the $Si_3N_4$ layer that functions as a stiffening layer during later heat treatment can, for instance, be achieved by plasma enhanced chemical vapor deposition (PECVD). The stiffening layer is patterned by dry etching with photolithography to form rectangular islands 4 sized from about 300 micrometers×300 micrometers to about 400 micrometers×400 micrometers and centered on the strained material islands 3.

Subsequently, heat treatment at 800° C. is performed for four hours in order to partially relax the strained material islands 3. Thereafter, the stiffening islands 4 are completely removed by dry etching and a second heat treatment is performed in order to completely relax the strained material islands 3. Thereby, complete relaxation of the strained InGaN islands 3 can be obtained with almost no buckling. Alternatively, islands of the stiffening material are formed with, say 800 micrometers×800 micrometers and after the first heat treatment the size of the stiffening islands 4 is reduced to 600 micrometers×600 micrometers, a second heat treatment is performed, the size of the stiffening islands 4 is reduced to 400 micrometers×400 micrometers, a third heat treatment is performed, etc., until no stiffening material is left. By such repeated relaxation processes complete relaxation of the strained material is achieved without any significant buckling.

Strained InGaN islands of a size of about 1 mm×1 mm and having a lattice mismatch of 0.7% will extend by about 7 micrometers during the relaxation. Nevertheless, the low-viscosity layer 2 may have a thickness of about 4 micrometers, i.e., less than the expansion length of the strained InGaN islands 3, without affecting the relaxation quality.

Figure 3:
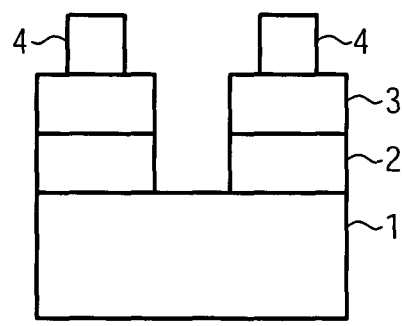
FIG. 3 illustrates another example of the inventive method for relaxing strained material islands wherein stiffening islands are formed atop of strained material islands formed over a patterned compliant substance.

FIG. 3 shows an example similar to the one described with reference to FIG. 2 with the exception that both the low-viscosity layer and the strained material layer are patterned to form islands of the low-viscosity material 2 and strained material islands 3 separated by one or more trenches. Again, stiffening islands 4 are centered on the strained material islands 3. As described above heat treatment and further size reduction of the stiffening islands 4 may repeatedly be performed to achieve complete relaxation of the strained material islands 3 without buckling.

All previously discussed embodiments are not intended as limitations but serve as examples illustrating features and advantages of the invention. It is to be understood that some or all of the above described features can also be combined in different ways.

What is claimed is:

1. A method for relaxing a strained material layer, the method comprising:
   providing a low-viscosity layer on a first face of a strained material layer;
   forming a stiffening layer on at least one part of a second face of the strained material layer so that lateral edges of the strained material layer are exposed, wherein the second face is opposite to the first face, thereby forming a multilayer stack by depositing a continuous layer of stiffening material on the strained material layer and subsequently patterning the deposited layer to at least partially remove part of the deposited layer from the strained material layer and at least expose the lateral edges of the strained material layer; and
   subjecting the multilayer stack to a heat treatment thereby at least partially relaxing the strained material layer,
   wherein the patterning the strained material layer is performed before the heat treatment thereby forming the strained material layer as a plurality of islands of strained material,
   wherein the stiffening layer is patterned such that islands of the stiffening layer are formed on the islands of the strained material, and
   wherein the patterning of the deposited layer and the subjecting of the multilayer stack to the heat treatment are repeated in this order at least once.

2. The method according to claim 1, wherein the stiffening layer is formed by deposition to a thickness that is between 50 nm to 5 times that of the strained material layer.

3. The method according to claim 1, wherein in each repeated patterning of the stiffening layer about 100 μm to 400 μm more than in the preceding heat treatment of the strained material is exposed.

4. The method according to claim 1, which further comprises patterning the low-viscosity layer.

5. The method according to claim 1, wherein the stiffening layer comprises SiN, SiON, $SiO_2$ or III-N materials.

6. The method according to claim 1, wherein the strained material layer comprises InGaN.

7. The method according to claim 1, wherein the low-viscosity layer comprises borophosphosilicate glass or an $SiO_2$ compound that includes boron or phosphorous.

8. The method according to claim 1, wherein the stiffening layer is formed by deposition to a thickness that is between 50 nm to 5 times the thickness of the strained material layer.

9. A method for relaxing a strained material layer, the method comprising:
   providing a low-viscosity layer on a first face of a strained material layer;
   forming a stiffening layer on at least one part of a second face of the strained material layer so that lateral edges of the strained material layer are exposed, wherein the second face is opposite to the first face, thereby forming a multilayer stack by depositing a continuous layer of stiffening material on the strained material layer and subsequently patterning the deposited layer to at least partially remove part of the deposited layer from the strained material layer and at least expose the lateral edges of the strained material layer;
   subjecting the multilayer stack to a heat treatment thereby at least partially relaxing the strained material layer;
   removing any residual parts of the stiffening layer so that the entire surface of the strained material is exposed and subjected to the heat treatment;
   transferring the at least partially relaxed strained material to a target substrate by bonding the relaxed strained material to the target substrate; and
   detaching the low-viscosity layer from the relaxed strained material.

10. A method for relaxing a strained material layer, which comprises:
    providing a low-viscosity layer on a first face of a strained material layer; and
    forming a stiffening layer on at least one part of a second face of the strained material layer, wherein the second face is opposite to the first face, thereby forming a multilayer stack, subjecting the multilayer stack to a heat treatment thereby at least partially relaxing the strained material layer;
    wherein the strained material layer is first grown on a seed substrate that is deposited on or attached to a first support substrate before depositing the low-viscosity layer on the strained material layer, and
    wherein the strained material layer is detached from the seed substrate and bonded by the low-viscosity layer to a second support substrate before depositing the stiffening layer on the strained material layer.

11. The method of claim 10, wherein the strained material layer is a strained InGaN layer, the seed substrate is or includes a GaN layer, the low-viscosity layer is a borophosphilicate glass, and the stiffening layer comprises $Si_3N_4$.

12. A method for the manufacture of a semiconductor device, the method comprising:
   providing a low-viscosity layer on a first face of a strained material layer;
   forming a stiffening layer on at least one part of a second face of the strained material layer so that lateral edges of the strained material layer are exposed, wherein the second face is opposite to the first face, thereby forming a multilayer stack;
   subjecting the multilayer stack to a heat treatment thereby at least partially relaxing the strained material layer;
   removing any residual parts of the stiffening layer so that the entire surface of the strained material is exposed and subjected to the heat treatment; and
   epitaxially growing material layers on the at least partially relaxed strained material.

13. A method for the manufacture of a semiconductor device, the method comprising:
   providing a low-viscosity layer on a first face of a strained material layer;
   forming a stiffening layer on at least one part of a second face of the strained material layer, wherein the second face is opposite to the first face, thereby forming a multilayer stack;
   patterning the strained material layer thereby forming the strained material layer as a plurality of islands of strained material;
   subjecting the multilayer stack that contains the patterned strained material layer to a heat treatment thereby at least partially relaxing the strained material layer;
   removing any residual parts of the stiffening layer so that the entire surface of the strained material is exposed and subjected to the heat treatment; and
   epitaxially growing material layers on the islands of the at least partially relaxed strained material;
   wherein the patterning of the deposited layer and the subjecting of the multilayer stack to the heat treatment are repeated in this order at least once.

14. A semiconductor structure comprising:
   a support substrate;
   a low-viscosity layer on the support substrate;
   a strained material on the low-viscosity layer, wherein the strained material is in the form of islands; and
   a stiffening layer only partially covering the upper surfaces of the strained material islands,
   wherein the lateral edges of the strained material islands are exposed.

15. The semiconductor structure of claim 14, wherein the stiffening layer allows 100 micrometers to 400 micrometers of width of the strained material to be exposed.

16. The semiconductor structure of claim 14, wherein the strained material is strained InGaN, the stiffening layer comprises SiN, SiON, $SiO_2$, or III-N materials, and the low-viscosity layer is a borophosphosilicate glass.

* * * * *